United States Patent [19]
Ullmann et al.

[11] Patent Number: 5,808,803
[45] Date of Patent: Sep. 15, 1998

[54] OPTICAL ARRANGEMENT FOR USE IN A LASER DIODE SYSTEM

[76] Inventors: Christopher Ullmann, Pfarrer-Hambuchenweg 12, Konigswinter D-53639; Volker Krause, Kupferbergstrasse 4, Kirchheimbolanden D-67292; Arnd Kosters, Unter den Garten 9, Mainz-Kostheim D-55246, all of Germany

[21] Appl. No.: 860,472
[22] PCT Filed: Dec. 19, 1995
[86] PCT No.: PCT/DE95/01813
§ 371 Date: Sep. 2, 1997
§ 102(e) Date: Sep. 2, 1997
[87] PCT Pub. No.: WO96/21877
PCT Pub. Date: Jul. 18, 1996

[30] Foreign Application Priority Data

Jan. 11, 1995 [DE] Germany ............... 195 00 513.9
Nov. 29, 1995 [DE] Germany ............... 195 44 488.4

[51] Int. Cl.⁶ .................................................. G02B 27/30
[52] U.S. Cl. ............................................................ 359/641
[58] Field of Search ................................... 359/641, 204, 359/618

[56] References Cited

U.S. PATENT DOCUMENTS

| | | | |
|---|---|---|---|
| 3,396,344 | 8/1968 | Francis et al. ............... | 372/35 |
| 4,530,574 | 7/1985 | Scifres et al. ............... | 359/641 |
| 4,547,038 | 10/1985 | Mori ............................ | 359/204 |
| 4,822,151 | 4/1989 | Tatsumo et al. ............. | 359/459 |
| 5,058,981 | 10/1991 | Umegake et al. ........... | 359/328 |
| 5,216,562 | 6/1993 | Luecke et al. ............... | 360/114 |
| 5,369,661 | 11/1994 | Yamaguchi et al. ......... | 372/69 |
| 5,453,814 | 9/1995 | Aiyer .......................... | 355/70 |

FOREIGN PATENT DOCUMENTS

0484276A1  5/1992  European Pat. Off. .

Primary Examiner—Georgia Y. Epps
Assistant Examiner—Ricky Mack
Attorney, Agent, or Firm—Hoffman, Wasson & Gitler

[57] ABSTRACT

An optical arrangement for collimation of a plurality of laser beams of several emitters or emitter groups of a laser diode arrangement which are located in one row or in several rows, the emitters or emitter groups of one row being located with their active layer in one common plane with a stipulated distance A in one axial direction, the arrangement including two sets of cylindrically acting collimation optics, wherein the arrangement includes means for deflection of the laser beams after passage through the two sets of collimation optics which are present parallel to one another in different beam planes offset against one another.

20 Claims, 13 Drawing Sheets

OPTICAL ARRANGEMENT FOR USE IN A LASER DIODE SYSTEM

BACKGROUND OF THE INVENTION

The invention relates to an arrangement for collimation of radiation from optoelectrical components in two coordinate directions which are perpendicular to one optical axis and which are perpendicular to one another and for subsequent focussing with high radiation density.

It is known that the radiation of a semiconductor diode laser is characterized by a strongly diverging beam, in contrast to other conventional laser beam sources with a laser beam which has a diameter of a few millimeters with low beam divergence in the range of a few mrad. A semiconductor diode laser has a divergence which is greater than 1000 mrad.

To be able to use the radiation of a semiconductor diode laser, collimating and focussing microoptics or optical arrangements are necessary. Here it can also be considered that a semiconductor laser diode conventionally has several emitters or emitter groups in a row at a distance of a few 100 microns. In the design of an optical arrangement or microoptics, it must therefore be considered that the lenses used must be provided so densely on the respective semiconductor diode laser or on the corresponding laser arrangement or on the chip that the laser radiation of the individual emitters or emitter groups is not superimposed before entering the optical arrangement, since otherwise due to unallowable or unsuitable angles of incidence the scattered radiation causes major radiation losses. In semiconductor laser diodes the divergence angle in the plane perpendicular to the active layer (fast axis) is greater than in the plane of the active layer (slow axis). This difference must be considered in the design of the optical arrangement.

Collimation of the diverging laser radiation from emitters or emitter groups using two cylindrical lenses arranged in succession in one optical axis is known, by the first cylindrical lens collimation taking place in the fast axis, i.e., in the axis perpendicular to the plane of the active layer, and by means of a second cylindrical lens farther away from the laser diode arrangement collimation in the slow axis taking place.

In particular, an optical arrangement (U.S. Pat. No. 3,396, 344) is known in which there are several laser diodes or emitters or emitter groups in at least two rows on top of one another, each row in the first coordinate direction in the plane of the active layer having several emitters or emitter groups, and the two rows in the second coordinate direction being offset against one another perpendicular to the active layer. For collimation of the individual beams for each row there is a first cylindrical lens as the collimation optics, that is, for collimation in the second coordinate direction (fast axis). For collimation in the first coordinate direction (slow axis) a cylindrical lens arrangement which forms second collimation optics has several cylindrical lens elements which are provided such that each of these cylindrical lens elements takes effect for the laser beams of two emitters which are located on top of one another and which are assigned to one another in the two adjacent rows and are directly adjacent to one another.

The adjacent cylindrical lens elements, in the first collimation optics, and especially in the second collimation optics, require a certain lens height and certain radius of curvature and also certain special spatial dimensions for the desired collimation, a relatively great distance of the individual emitters or emitter groups in each row is necessary. This means a relatively small occupation density of the chip which forms the laser diode arrangement, although in terms of chip technology and with respect to the development of high-power coolers a much higher occupation density and thus much higher output power would be possible. The disadvantage in the known optical arrangement and especially with a host of emitters or emitter groups in each line, imaging or focussing of the laser beams occurs at the focal point, in which the focal diameter in the first coordinate direction is greater than in the second.

The object of the invention is to devise an optical arrangement which with a relatively simple structure which avoids the aforementioned defects and in particular enables much smaller distances between the emitters or emitter groups or a row of these emitters or emitter groups and thus a much higher occupation density of a chip which forms the laser diode arrangement, and an increase of the output power.

To achieve this object an unique optical arrangement is provided.

SUMMARY OF THE INVENTION

The particular feature of the invention lies in that the laser radiation, of adjacent emitters, or emitter groups of a row, is deflected such that the collimated laser beams of adjacent emitters or emitter groups after passage through the second collimation optics are present parallel to one another in different beam planes offset against one another, i.e., for example, in the beam planes offset against one another in the axis perpendicular to the plane of the active layer. In these planes the laser beams are each collimated in the slow axis, i.e., for example in the first coordinate direction, so that the collimation elements used for this purpose, for example cylindrical lens elements, of the second collimation optics are located in these beam planes and thus collimation elements located in different beam planes can overlap. In this way small distances between the individual emitters or emitter groups and thus a high occupation density can be accomplished. If the number of beam planes used is n and a is the distance between adjacent emitters or emitter groups, on the second collimation optics the distance of the collimation elements in each beam plane is n×a, i.e., even at a small distance a and high occupation density the distance of the collimation elements necessary for structural reasons can be accomplished in each beam plane.

For the purposes of the invention "non-centrally imaging collimation optics" or "cylindrically active collimation optics" are generally defined as cylindrical optics or optics which image identically or similarly to a cylindrical lens.

The laser beams collimated in the two planes can then be imaged by focussing optics in a common three-dimensional area or focus.

One special advantage of the invention is that while maintaining a relative simple structural shape, the use of a laser diode arrangement with high occupation density and high laser power is possible without losses occurring due to scattered radiation. Therefore, semiconductor diode lasers for extremely high powers can be built using the available high performance cooler technology.

The invention offers the advantage that for a stipulated number of emitters of emitter groups in a row, by corresponding selection of the number of beam planes, the shape of the focal point can be made as desired, for example a round or almost round focal point.

In one simple embodiment of the invention, the emitters or emitter groups are arranged only in one row. But in the invention it is also possible to provide several rows of these emitters, or emitter groups, in one coordinate direction perpendicular to the plane of the active layer.

BRIEF DESCRIPTION OF THE DRAWINGS

The invention is explained in the following using the figures on embodiments.

DETAILED DESCRIPTION OF THE INVENTION

In the figures three coordinate directions perpendicular to one another are each labelled X, Y and Z and in the following are also called the X axis, the Y axis, and the Z axis.

Figure 1:
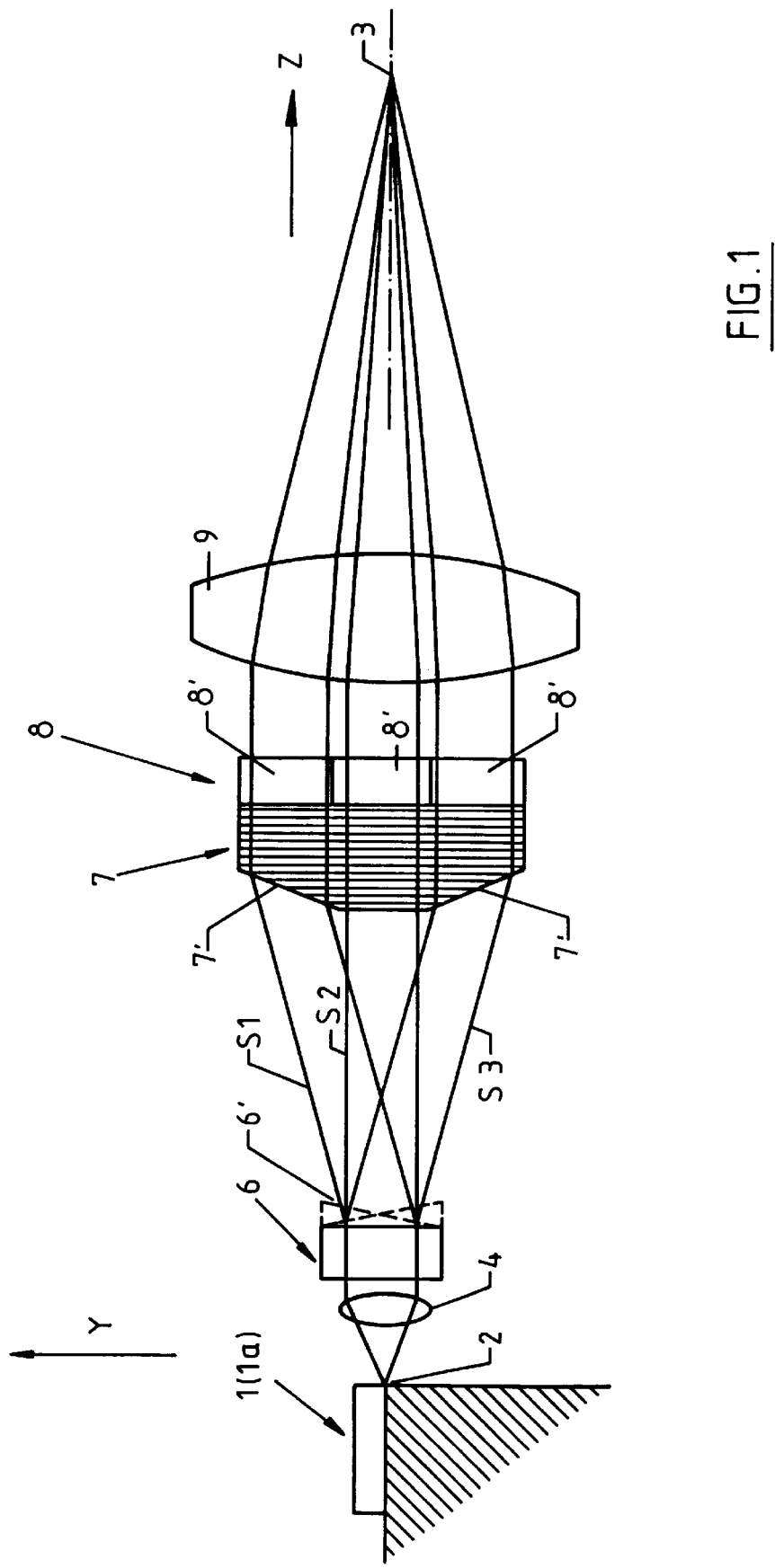
FIG. 1 shows in a simplified representation and in a side view a laser diode arrangement with several emitters or emitter groups located in succession in one coordinate direction perpendicular to the plane of the drawing of this Figure (X axis) and with one embodiment of the optical arrangement as claimed in the invention for focussing of the radiation of the individual emitters at a common focus.
Figure 2:
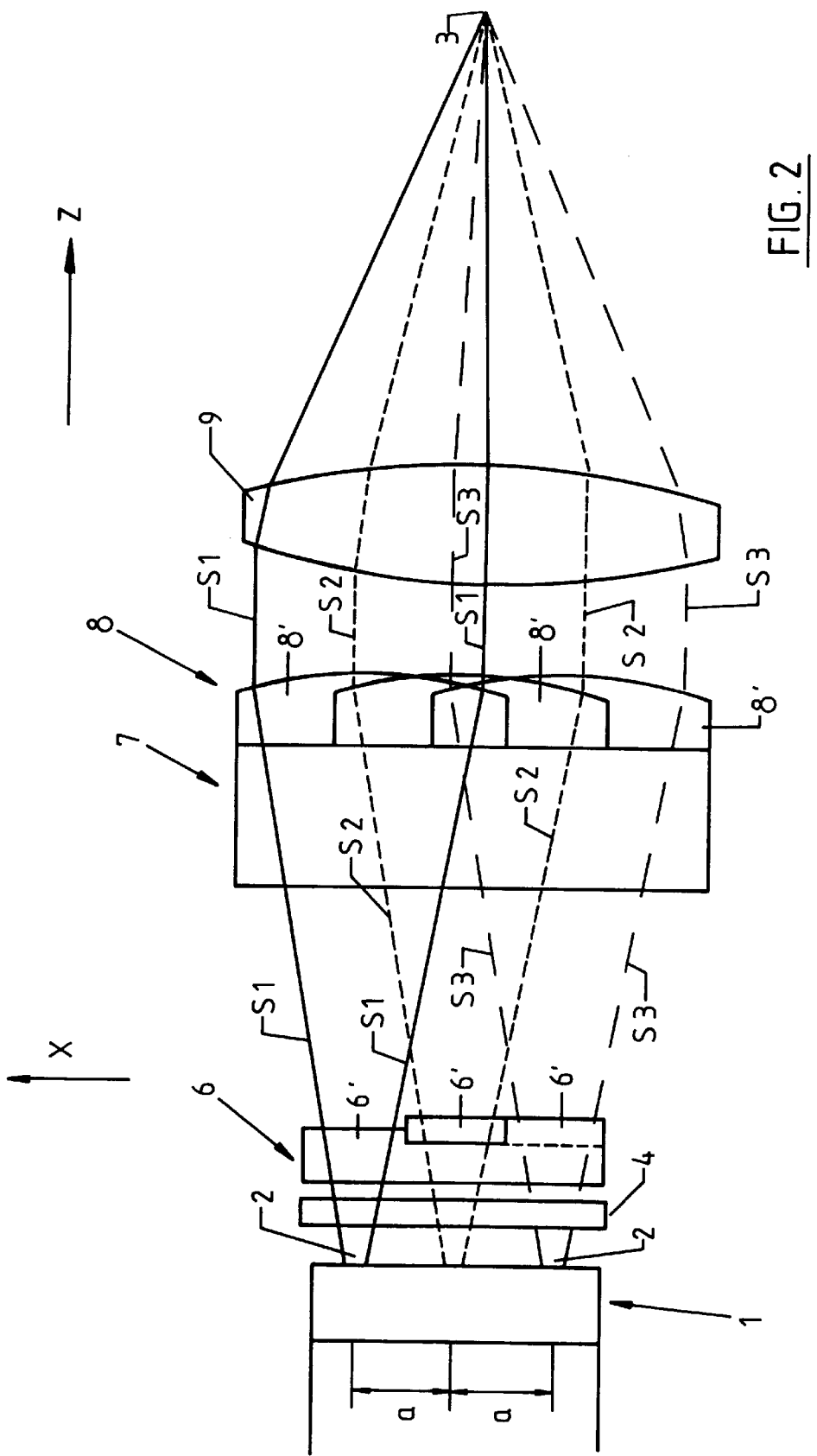
FIG. 2 shows the laser diode arrangement and the pertinent optical arrangement of FIG. 1 in an overhead view, i.e., in a view turned 90 degrees compared to FIG. 1 in an embodiment in which the X axis perpendicular to the plane of the drawing of FIG. 1 there are three emitters or emitter groups following one another.

FIGS. 1 and 2 show laser diode arrangement 1 in the form of a laser diode chip which for the sake of simpler representation and explanation has a total of only three emitters or emitter groups 2 which are arranged in the direction of the active layer of this emitter in the X-axis in a row following one another and with a stipulated distance a.

Individual emitters or emitter groups 2, as was detailed above, deliver radiation which diverges much more strongly in the plane perpendicular to the active layer (plane of FIG. 1) than in the plane of the active layer (plane of the drawing of FIG. 2). For better understanding, the edge lines of the beams of three emitter groups 2 are each labeled S1, S2, and S3 in FIGS. 1 and 2.

To be able to fully use the radiation of emitter groups 2 it is necessary to focus this radiation at a common point 3 such that in the two planes, i.e., in the plane perpendicular to the active layer of emitter groups 2 and in the plane parallel to this active layer the focal diameter is of the same size as much as possible, i.e., a focal point as round as possible is achieved, as is necessary or at least feasible for example for feed of radiation at point 3 into laser optics which are not shown.

Focussing takes place by means of the optical arrangement likewise shown in FIGS. 1 and 2. It consists of the following components which adjoin one another in the sequence of the following enumeration, proceeding from laser diode arrangement 1 in the direction of the optical axis of the optical arrangement or in the direction of the Z axis, in the embodiment shown this optical axis which runs through focal point 3 lying in the plane of the active layer of the emitter groups and taking place perpendicular to the X axis:

cylindrical lens element or cylindrical lens 4 with aspherical cylindrical surface;

first prism block 6 with several prism elements 6' located in succession in the active plane of emitter groups 2, i.e., in the X axis, and in the direction perpendicular to the optical axis, the number and spacing of prism elements 6' corresponds to the number of emitter groups 2 and their spacing a;

second prism block 7 with a total of three different prism elements 7' provided in one coordinate direction perpendicular to the optical axis and perpendicular to the active plane of emitter groups 2, i.e., following one another in the Y-axis;

cylindrical lens arrangement 8 which has several cylindrical lens elements 8' which are arranged with their cylinder axes in the coordinate direction of the Y axis and relative to this Y axis in three planes on top of one another and in the X axis of the plane, each time offset to the plane by an amount which is equal to distance a of emitter groups 2;

collimating lens 9 which is made rotationally-symmetrical to the optical axis or Z axis and which is a biconvex lens in the embodiment shown.

Instead of collimating lens 9, there can be another optical focussing means, for example a multi-lens focussing means.

How this optical arrangement works can be described as follows:

Laser beam S1–S3 of each emitter group 2 which has a large divergence angle parallel to the active layer in the respective plane and also perpendicular to the active layer in the respective plane is collimated except for a few mrad divergence first in the plane (Y-Z plane) perpendicularly to the active layer by cylindrical lens arrangement 4 which is located in the X axis with its cylinder axis. Cylindrical lens element 4 for this reason, as detailed above, has an aspherical cylinder surface. The dimensions of the respective laser beam after collimation are for example 0.5 to 1.5 mm. The laser beam of each emitter group, collimated in the respective Y-Z plane perpendicular to the active layer is incident on prism element 6' of first prism block 6, i.e., the element provided for this emitter group.

Individual prism elements 6' are made such that they cause deflection of the laser beam in the plane perpendicularly to the active layer in a different form, and laser beam S1 of one outlying emitter group 2 is deflected upward by pertinent prism element 6' by an acute angle, for example by an angle of 10 degrees in the representation chosen for FIG. 1. Laser beam S2 of middle emitter group 2 does not undergo deflection by pertinent prism element 6' and laser beam S3 of other outlying emitter group 2 is deflected downward by an angle, i.e., in this embodiment by the same angle as beam S1, for example by an angle of 10 degrees. The width of prism elements 6' in the direction of the X-axis corresponds exactly to distance a of emitter groups 2.

Deflected beams S1–S3 which diverge in the X-Z plane and which are collimated in the Y-Z plane are incident on larger second prism block 7 or on prism element 7' which is provided there for each beam S1–S3 and thus separately for each emitter group 2. The surfaces of these prism elements 7' which lie perpendicular to the Y-Z plane and which face prism block 6 are inclined relative to the optical axis or Z axis or enclose an angle with this axis such that there are laser beams S1–S3 parallel on top of one another in prism block 7 in the three radiation planes.

On the side of prism block 7 facing away from prism block 6 there is cylindrical lens arrangement 8, for example by virtue of the fact that on this plan side of prism block 7 which lies in a plane perpendicularly to the optical axis (Z-axis) individual half cylinder lens elements 8' are cemented on top of one another in the above described arrangement in three rows. Each cylindrical lens element 8' is in turn assigned to beam S1–S3 and causes collimation of this beam S1, S2 or S3 in the X-Z plane so than then following cylindrical lens arrangement 8 each beam is collimated both in the X-axis and also in the Y-axis and beams S1–S3 collimated in this way can be imaged with conventional collimating lens 9 onto common focal point 3. Plano-convex cylinder element 8' can be spherical or aspherical.

It goes without saying that the described optical arrangement can also be used for emitter arrangements which have more than three emitter groups. In this case for example only the number of prism elements 6' and thus the number of beams S1–Sn deflected into the three beam planes are increased, then in larger prism block 7 in each beam plane there being two or more than two beams next to one another and cylindrical lens arrangement 8 in each plane having at least two cylindrical lens elements 8' which have a distance from one another in each plane which is equal to distance a of the emitter groups on laser diode arrangement 1 multiplied by the number of beam planes in prism block 7. It goes without saying that with an appropriate formation of prism blocks 6 and 7 there can also be more than three beam planes in the Y axis on top of one another, for example, five beam planes on top of one another.

Figure 3:
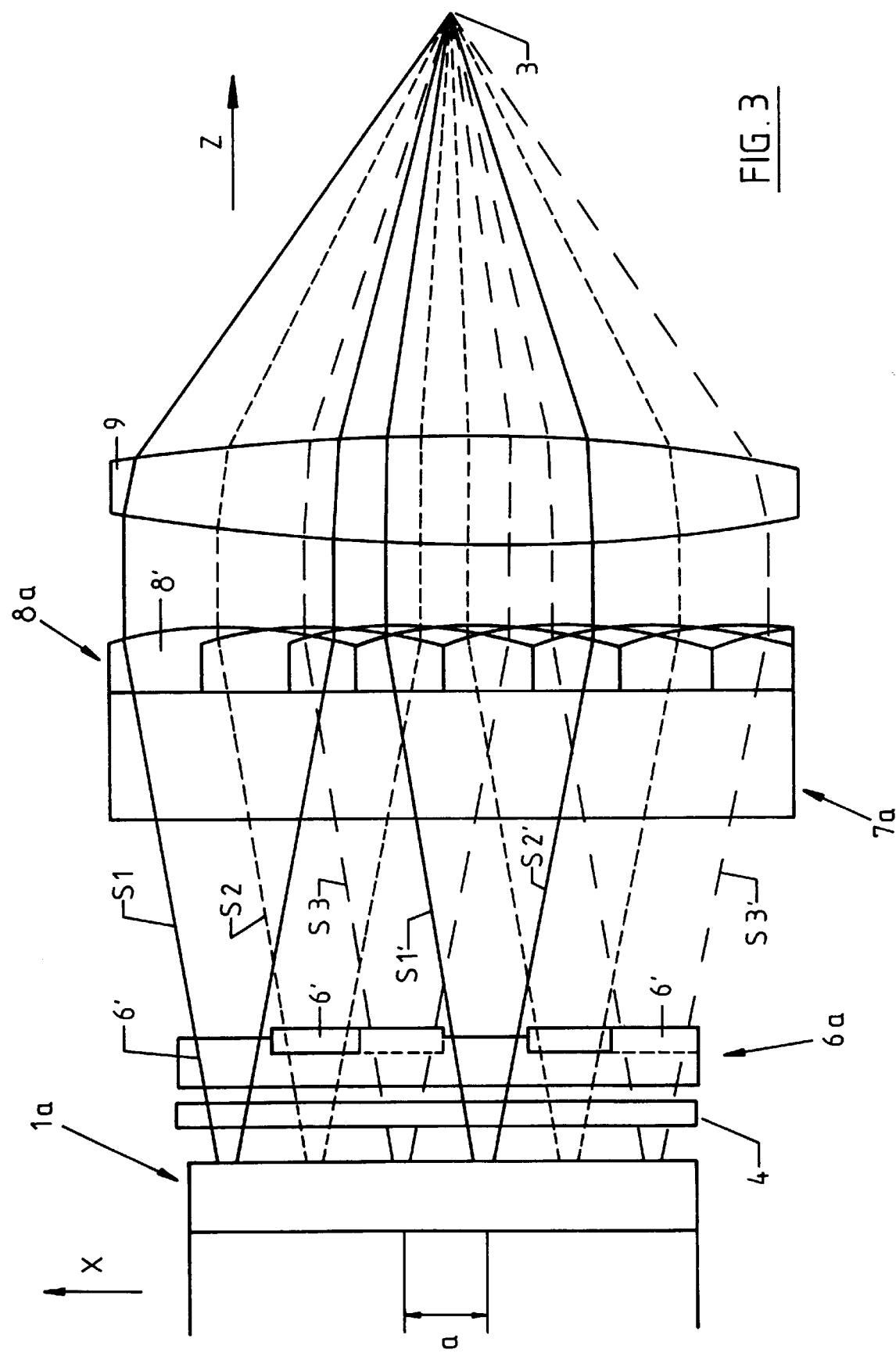
FIG. 3 shows a view like FIG. 2, but in an embodiment in which parallel to the active layer of the laser diode arrangement, i.e., in the X axis, there are a total of six emitters or emitter groups.

FIG. 3 shows in a similar representation to FIG. 2 one embodiment in which laser beam arrangement 1a has a total of six emitter groups 2 with laser beams which are deflected by prism block 6a such that within prism block 7a there are in turn three beam planes which are located on top of one another in the Y-axis, and in each beam plane in the direction of the X axis next to one another two independent beams, specifically, in the upper plane, beams S1 and S1', in the middle plane beams S2 and S2', and in the lower plane beams S3 and S3'. The number of prism elements 6' is equal to the number of emitter groups. The number of prism elements 7' is equal to the number of beam planes. In addition, prism elements 6' are made such that the beam of one emitter group 2 is deflected together with that beam into one beam plane which corresponds to emitter group n which follows in the row of the emitter group, n being the number of beam planes located on top of one another in the Y axis. Instead of cylindrical lens arrangement 8, in FIG. 3 cylindrical lens arrangement 8a is used which in each beam plane has two cylindrical lens elements 8' which are offset from beam plane to beam plane in turn by distance a in the X axis and in this axis in each beam plane having a distance of n×a.

With the design as claimed in the invention, when the laser beams of the emitter groups are divided among two beam planes a major improvement is achieved, especially also with respect to focussing relative to known optical arrangements which do not provide for splitting of the laser beams in different beam planes. For this reason reference is made to the following table. It compares the imaging behavior of a laser diode arrangement with a length of 10 mm in the X axis and with an emitter distance of 800 microns and an emitter width of 400 microns for three different optical arrangements for an arrangement with only one beam plane, i.e., without deflection (plane 1), for the arrangement described in conjunction with FIGS. 1–3 with three beam planes (3-plane) and for an optical arrangement in which the deflection takes place in five beam planes located on top of one another in the Y-axis (5-plane).

On the laser diode chip or rods there are thirteen emitter groups. To estimate the effect of the first collimation optics, i.e., cylindrical lens arrangement 4, a full divergence angle of 20 mrad in the Y-axis is assumed after transmission of the laser beams through this lens arrangement. The divergence angle of an individual emitter group 2 determines the distance of cylindrical lens arrangement 8 or cylindrical lens element 8' of the laser diode arrangement or of the laser diode chip, since the ideal distance is stipulated by the distance of the site of superposition of the radiation of two emitter groups from the laser diode chip. The divergence angle in the X-Z plane is assumed to be 10degrees for the computation. For focussing with collimation lens 9 a numerical aperture of 0.2 is used; this corresponds to the conventional numerical aperture for fiber coupling in a quartz fiber. This opening angle is then 23 degrees.

TABLE

|  | 1-plane | 3-plane | 5 plane |
|---|---|---|---|
| Focal length of cylindrical lens 8 (mm) | 2.28 | 11.43 | 20.57 |
| Focal length of collimating lens 9 (mm) | 25.6 | 29.5 | 34.4 |
| Magnification | 11.2 | 2.6 | 1.67 |
| Focal diameter in X axis (mm) | 4.48 | 1.04 | 0.67 |
| Focal diameter in Y axis (mm) | 0.51 | 0.59 | 0.69 |

This table confirms that in an optical arrangement with only one plane based on the very low focal length of the "slow axis optic", i.e., the optics which causes collimation in the X axis, the greatest extension of the focus is in this plane. If conversely the radiation of the emitter groups is divided among several beam planes, as the invention calls for, a much smaller focal diameter can be achieved, especially also in the X axis, it also being possible with a corresponding number of beam planes to achieve almost round focal point 3, i.e., the same focal diameter in the X and Y axis.

It is also important in the invention that splitting of the beams into the different beam planes is completed in any case by the time of entry into cylindrical lens arrangement 8 or 8a, so that then for this arrangement, depending on the configuration (two or more than two planes), 10–20 mm are available as the focal length. At a lens height of 1 mm, at a distance of 5 mm between the exit side of respective prism element 6', at the entry surface of respective prism element 7' and at a refractive index of 1.5 of these elements, when using three beam planes the angle of incline of the positively and negatively bevelled surfaces of prism elements 6' is roughly 20 degrees. This angle can be reduced, for example, by a high refractive index of prism elements 6' and 7', by a lower lens height of lens elements 8', and by a greater distance between prism blocks 6 and 7.

Figure 4:
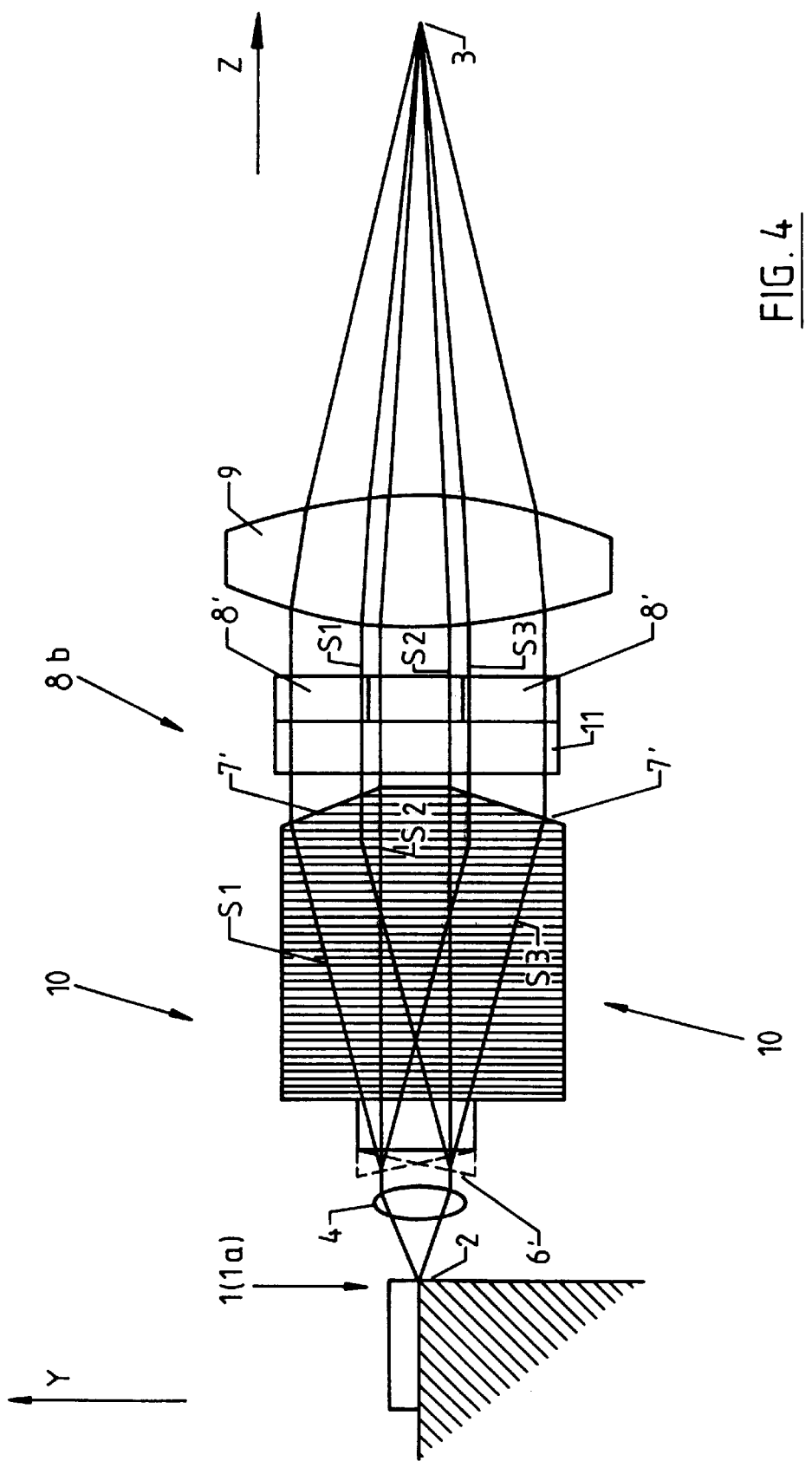
FIGS. 4 and 5 in a representation like FIG. 1 show other possible embodiments of the invention.

FIG. 4 shows another possible embodiment which differs from the embodiment of FIG. 1 in that instead of separate prism blocks 6 and 7 there is combined prism block 10 which on its side facing cylindrical lens element 4 forms prism elements 6' and on its output side facing cylindrical lens arrangement 8b forms prism elements 7' or the corresponding prism surfaces. Cylindrical lens arrangement 8b corresponds to cylindrical lens arrangement 8 or 8a, but is provided separately from prism block 10 and for this reason consists of optically neutral disk 11 onto which cylindrical lens elements 8' are cemented.

Figure 5:
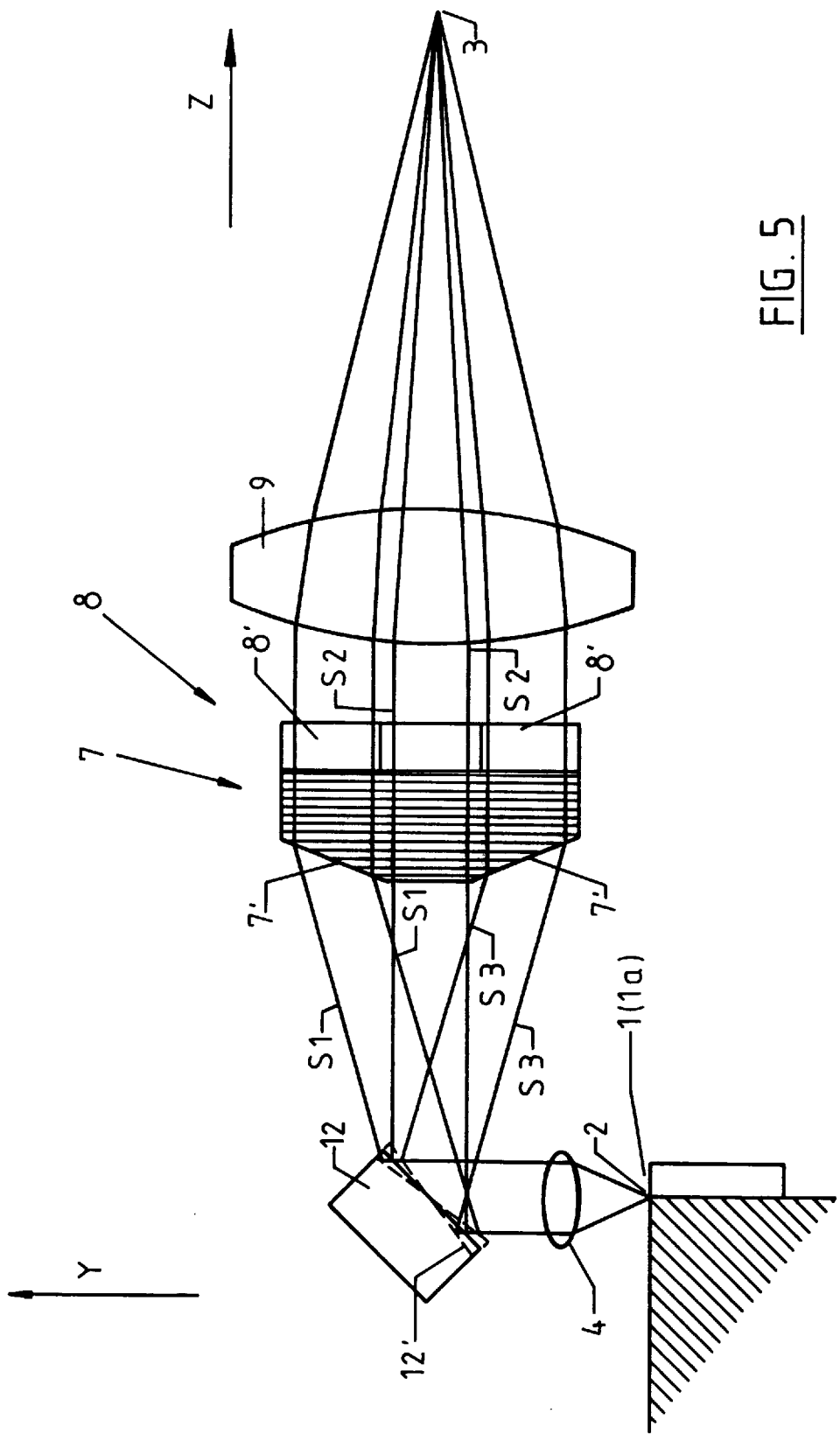

FIG. 5 shows an embodiment which differs from the embodiment of FIG. 1 in that instead of prism block 6 or one transparent element there is reflecting element 12 which forms reflection surfaces 12' which are different for each emitter group 2 in order in turn to achieve the described deflection of beams S1–S3 or S1–S3' into the different beam planes.

Figure 6:
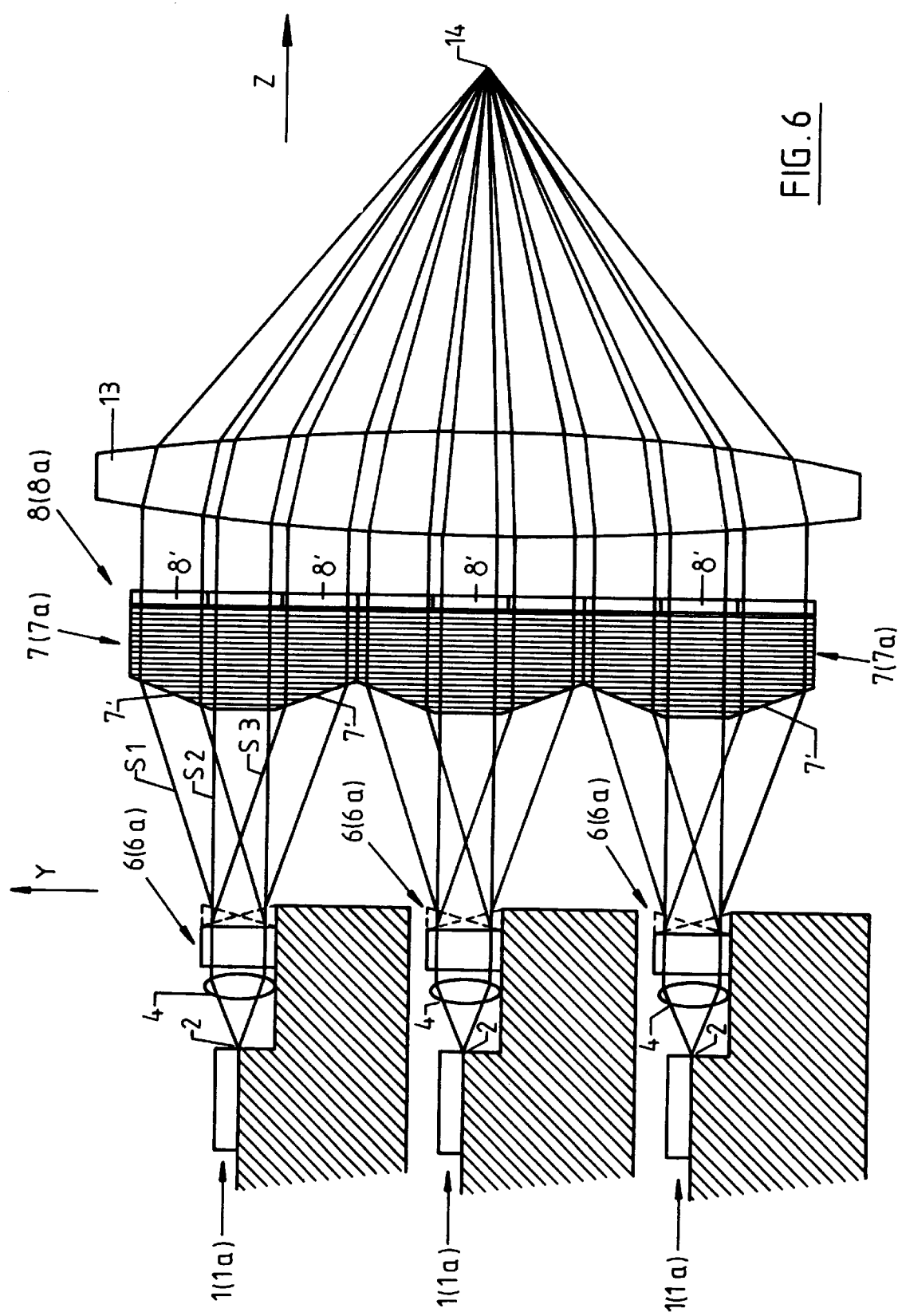
FIG. 6 shows in a view like FIG. 1 another embodiment in which in a plane perpendicular to the active layer there are several rows of emitters or emitter groups on top of one another, arranged in succession in each row perpendicular to the plane of the drawing in the Figure, and an optical arrangement for focussing of the radiation of all the emitters or emitter groups at a common focus.

FIG. 6 finally shows an embodiment in which several laser diode arrangements 1 or 1a are located in the Y axis on top of one another, each laser diode arrangement 1 or 1a in turn having a host of emitters or emitter groups 2 in the X axis.

Prism blocks 6 and 7 with cylindrical lens arrangement 8 are assigned to each laser diode arrangement 1 or 1a in order to split the individual beams of the emitter groups into different beam planes, i.e., in the representation chosen for FIG. 6 in turn for each laser diode arrangement into three beam planes and there to collimate them both in the X axis and Y axis. Instead of collimating lens 9, in this embodiment there is collimating lens 13 which is common to all laser diode arrangements 1 or 1a, with which the laser beams are then imaged or combined at common focal point 14.

Figure 7:
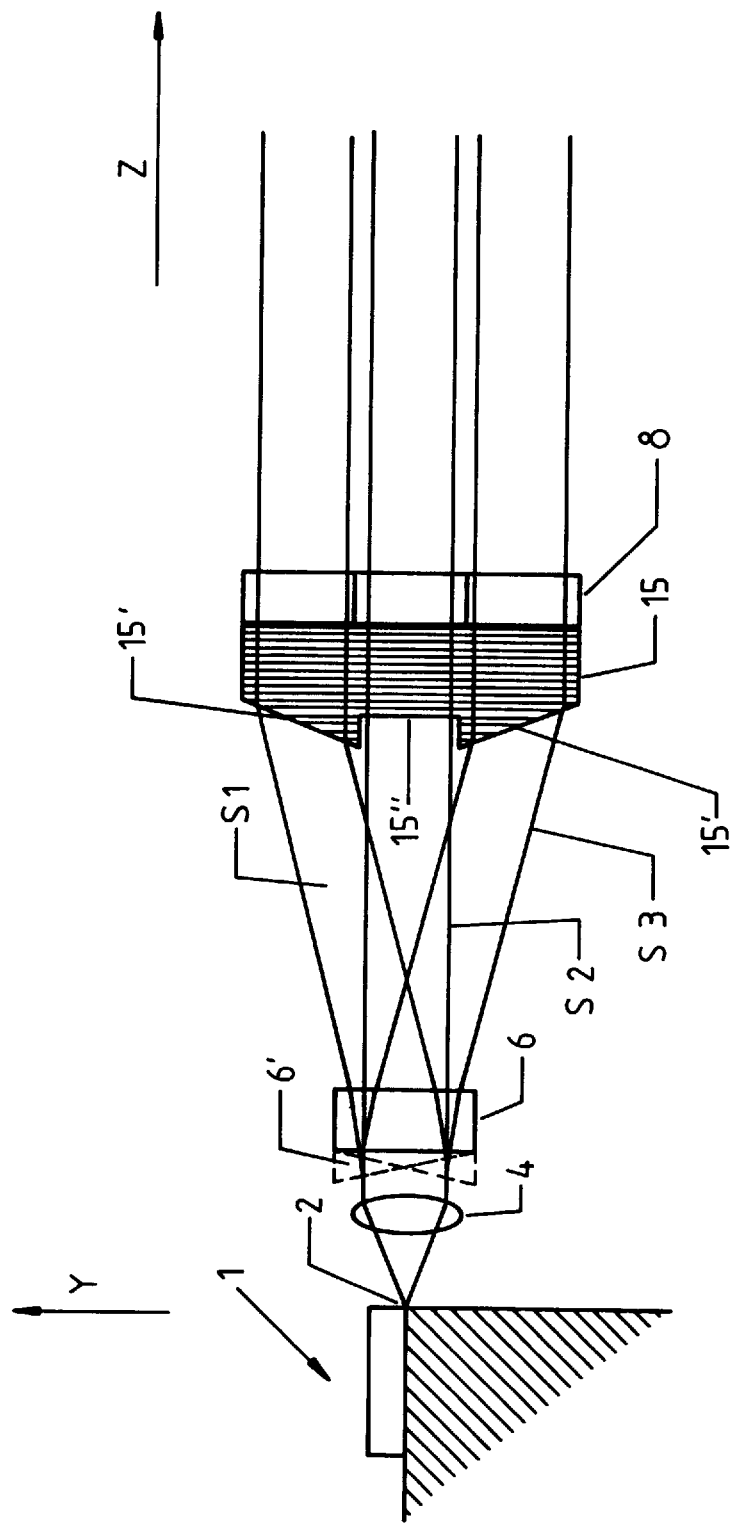
FIGS. 7 and 8 in a representation like FIGS. 1 and 2 show another possible embodiment.
Figure 8:
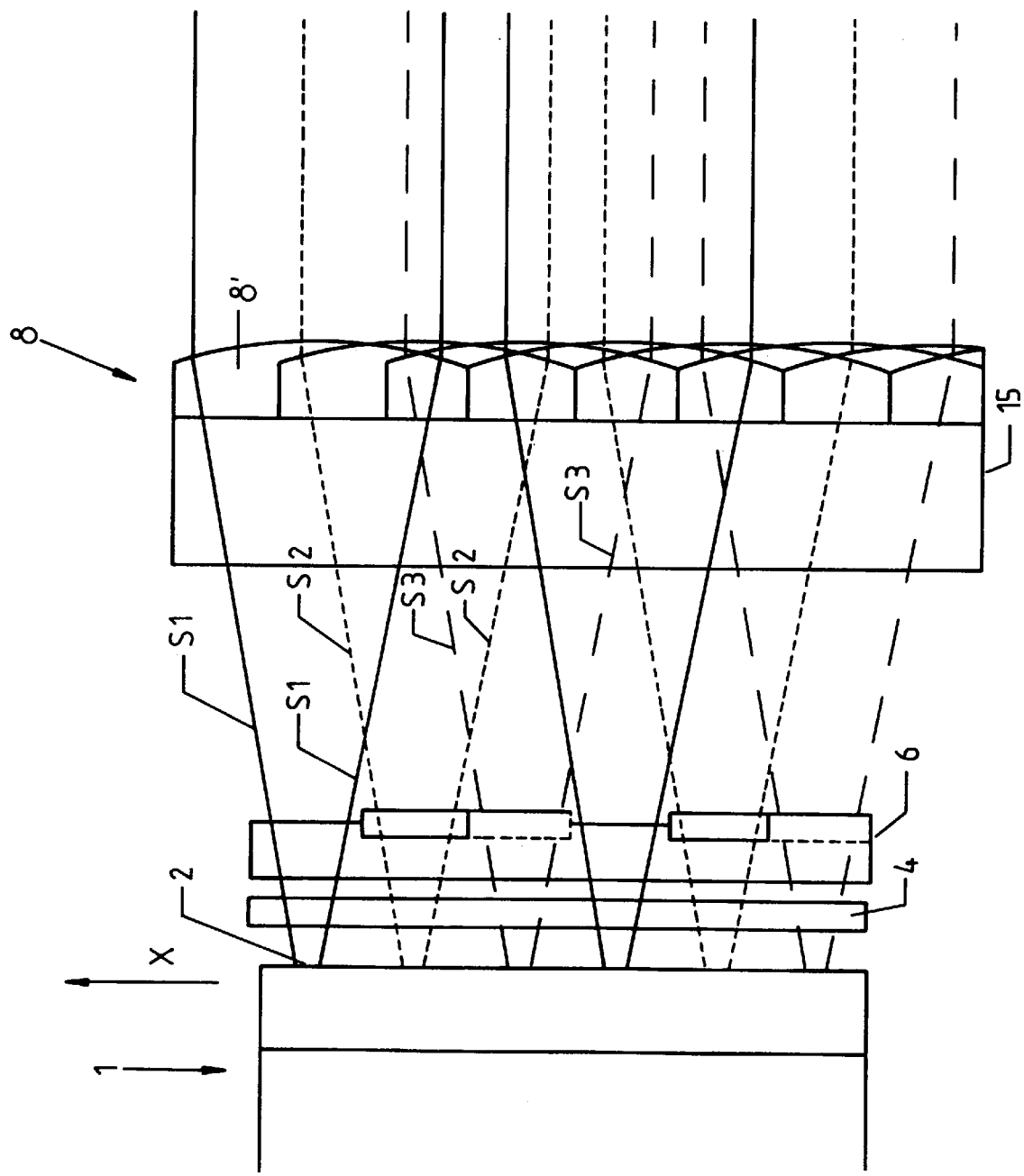

FIGS. 7 and 8 show an embodiment which differs from that of FIGS. 1 and 2 essentially only in that the oblique surfaces of prism elements 6' are located on the side of prism block 6 facing cylindrical lens arrangement 4 and that instead of prism block 7 there is prism block 15 which to achieve three beam planes offset in the direction of the Y axis in turn has three prism elements 15', of which the prism surfaces of the two outer ones include an angle with the X-Y plane and the surface of middle prism element 15' is parallel to this plane.

The prism surface of middle prism element 15' facing prism block 6 is formed by the bottom of depression 15" of prism block 15, by which the length of the light path is shortened by prism block 15 in the middle one. In this way compensation of phase and transit time differences of laser beams S1–S3 is achieved such that focussing of all beams exactly in one plane is possible.

Figure 9:
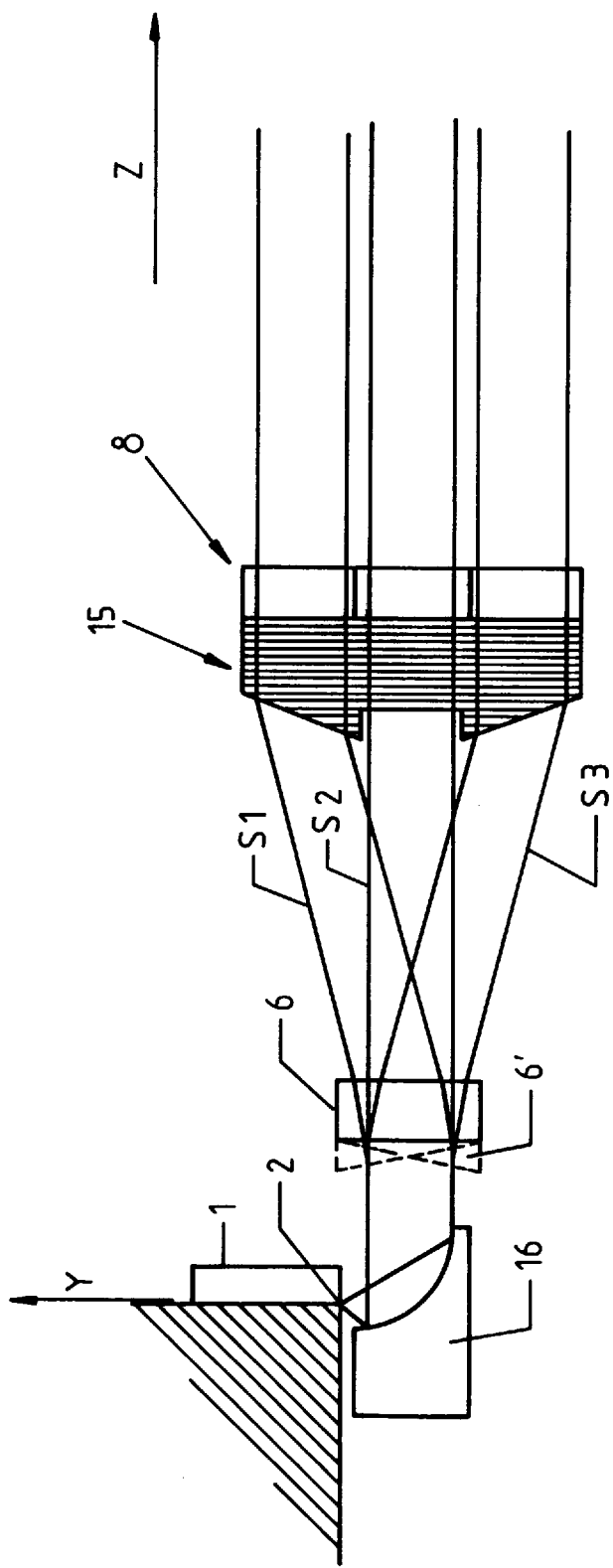
FIGS. 9–11 in one view show other embodiments which differ by the first collimation optics.

FIG. 9 shows one embodiment which differs from the embodiment of FIGS. 7 and 8 essentially in that instead of cylindrical lens arrangement 4 as the first collimation optics mirror 16 is used which is concavely curved around only one axis, specifically around an axis parallel to the X axis, and extends in the X axis. Using this mirror, at the same time deflection of laser beams S1–S3 by 90 degrees is caused such that emitters or emitter groups 2 of laser diode arrangement 1 in this embodiment are located in the X-Y plane. The special advantage consists in that with several rows of emitter groups in a common X-Y plane can be provided; this among others greatly simplifies the means used for cooling, since for all emitter groups a common cooling means is then possible. The rows of emitter groups 2 of one such laser diode arrangement which has several rows of emitter groups are then provided on top of one another in the Y axis, each with interposed mirror 16 which can then also be part of a substrate which bears emitter groups 2.

Figure 10:
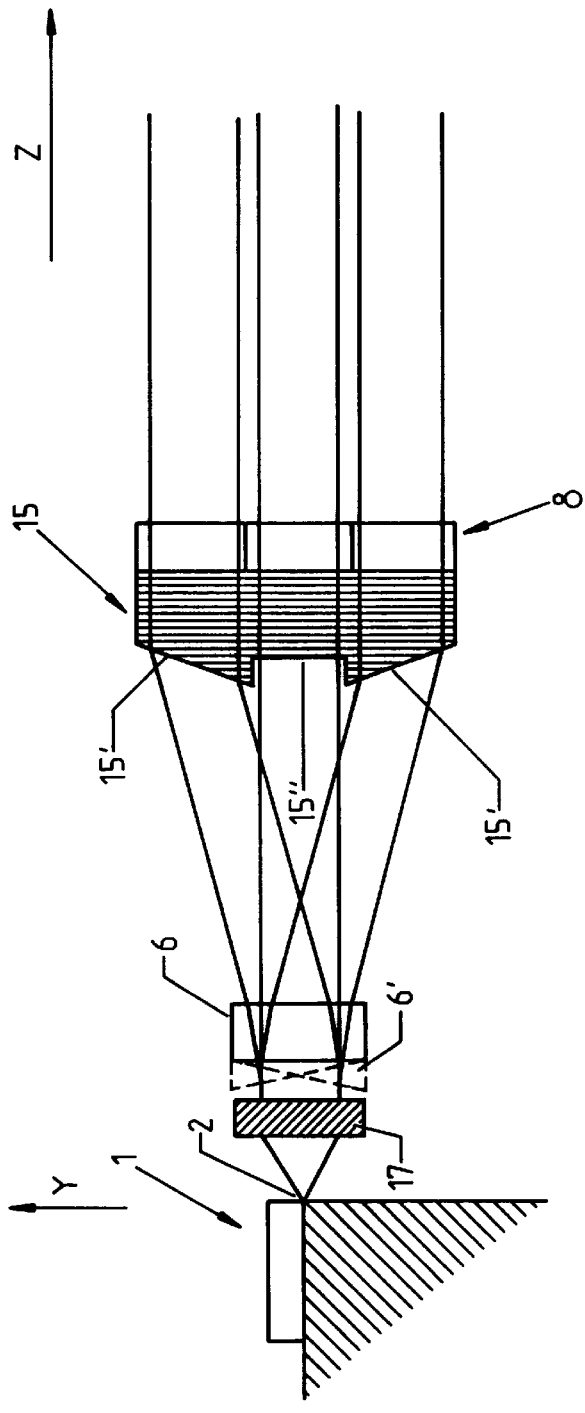
Figure 11:
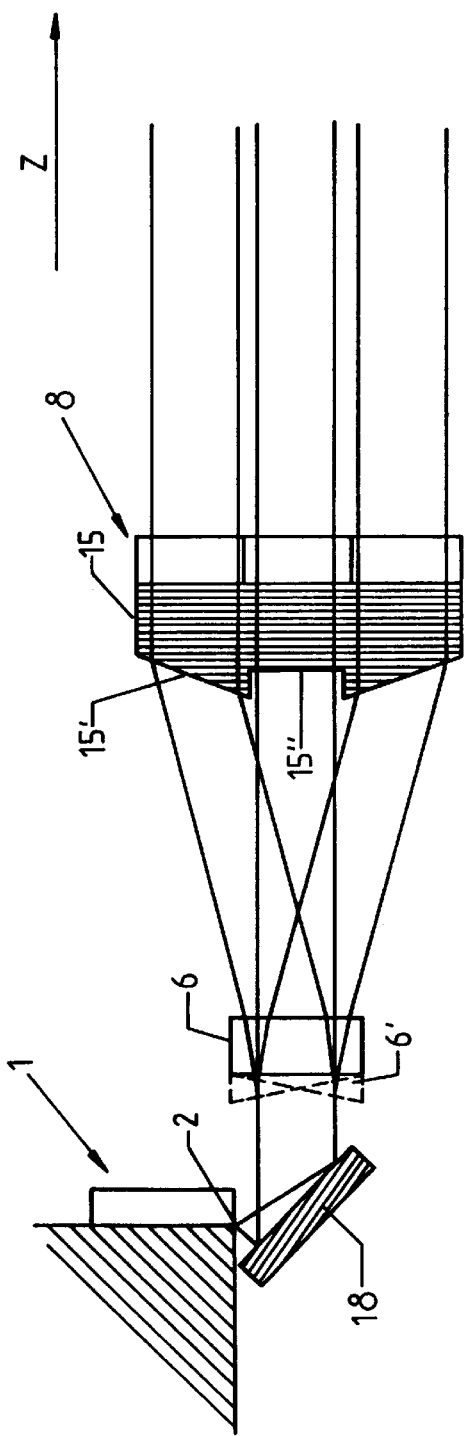

The embodiment shown in FIGS. 10 and 11 differs from that of FIGS. 7 and 8 essentially only in that instead of cylindrical lens arrangement 4 as the first collimation optics there is a holographically acting optical element 17 (FIG. 11) or reflecting element 18 (FIG. 11) which is penetrated by laser beams S1–S3.

Figure 12:
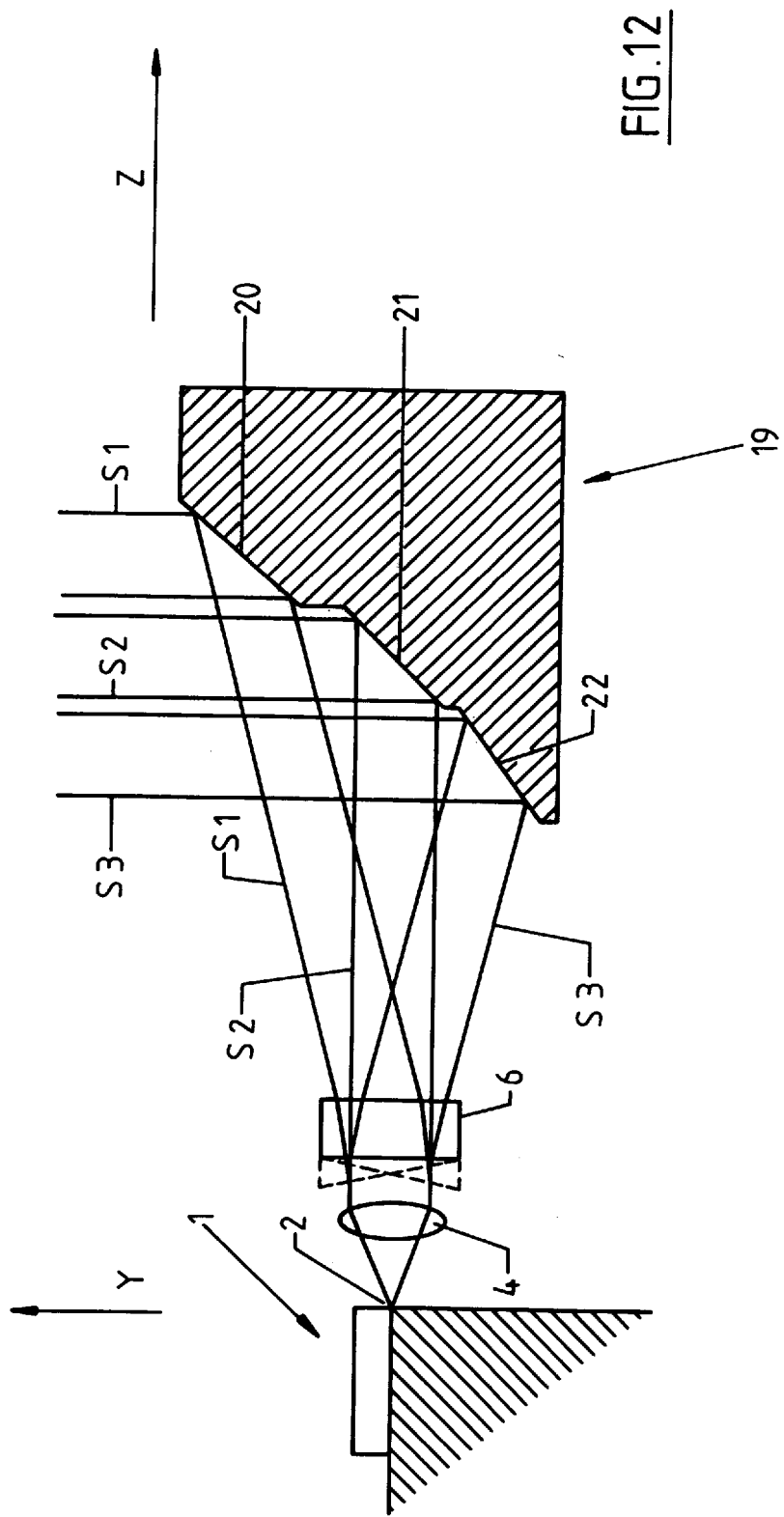
FIGS. 12–14 in a partial representation show other possible embodiments of the invention.

Finally FIG. 12 shows in a partial representation another possible embodiment which differs from the embodiment of FIG. 1 essentially in that instead of prism block 7 there is a reflection means or mirror arrangement 19 which for each laser beam S1–S3 deflected by prism block 6 at different angles forms reflection or mirror surface 20–22. The latter each lie in one plane parallel to the X axis which runs perpendicular to the plane of the drawing in FIG. 12 and perpendicular to the X-Z plane and with the X-Y plane enclose a different angle, and specifically mirror surface 21 for beam S2 encloses an angle which is larger than the angle of mirror surface 20, and mirror surface 22 encloses an angle which is greater than the angle of mirror surface 21. The incline of mirror surfaces 20–21 is furthermore selected such that the beams reflected on them are parallel to one another and lie in different beam planes which in this embodiment are offset against one another, not in the direction of the Y axis, but in the direction of the Z axis. Reflected parallel beams S1–S3 are then supplied to cylindrical lens arrangement 8 which is not shown in this Figure and which is then located likewise turned 90 degrees relative to FIG. 1.

Figure 13:
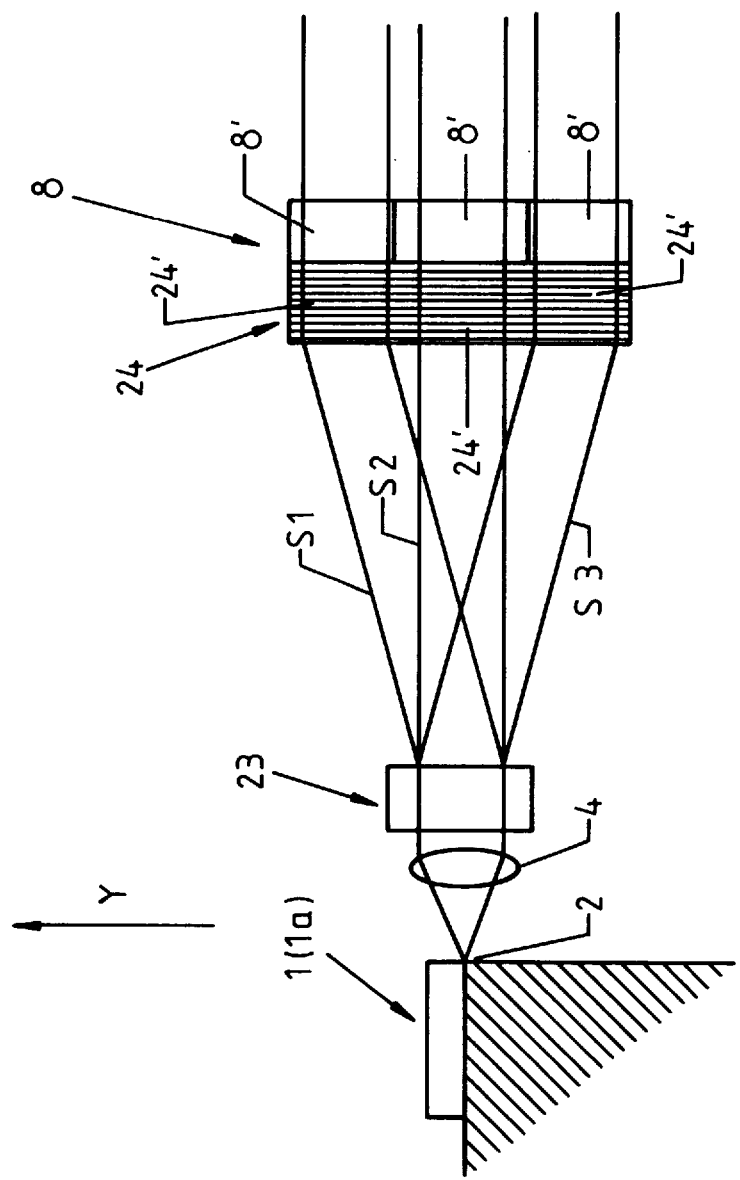
Figure 14:
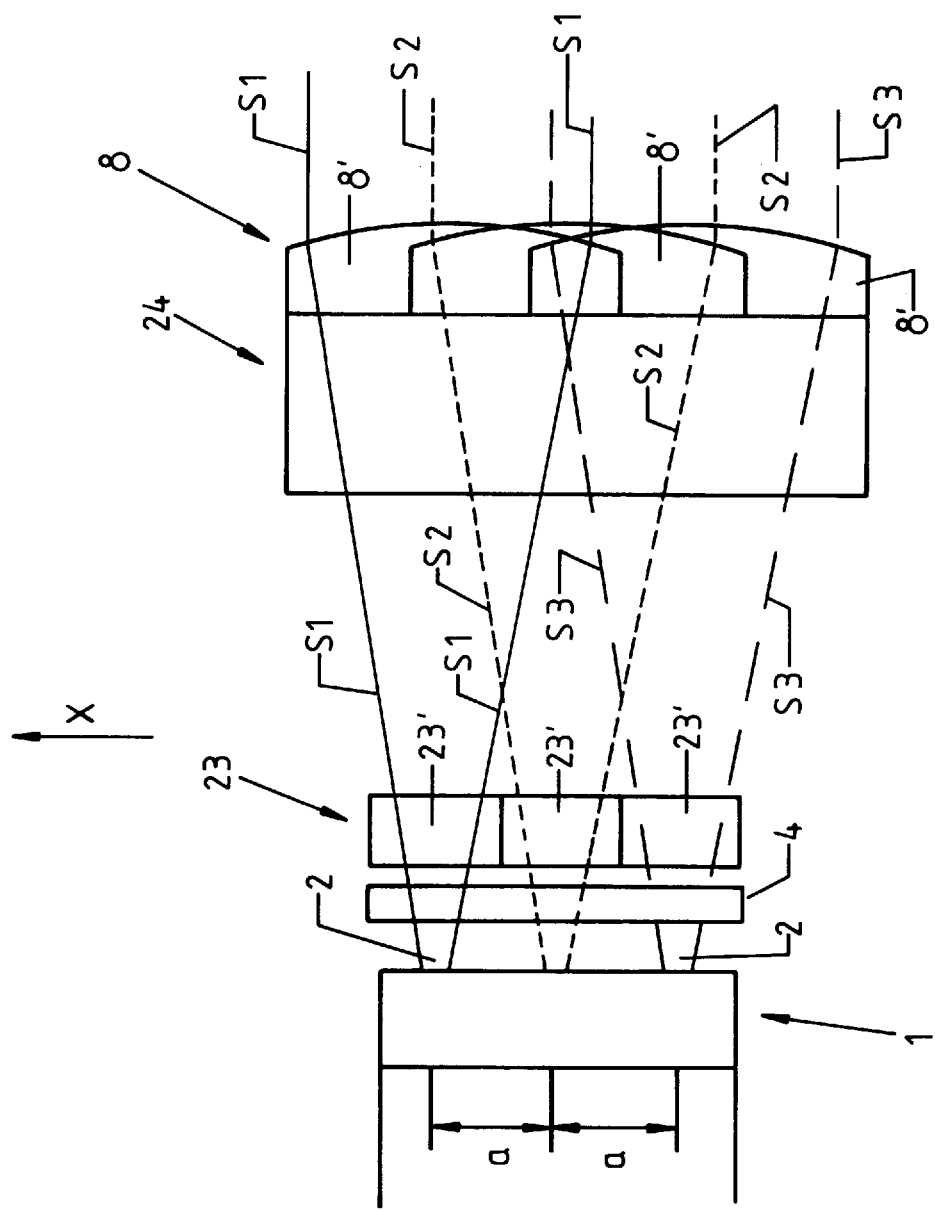

FIGS. 13 and 14 in a representation similar to FIGS. 1 and 2 show another possible embodiment of the invention which differs from that of FIGS. 1 and 2 essentially only in that instead of prism blocks 6 and 7 which form deflection means or instead of prism elements 6' and 7' there are diffractive optical elements, i.e., light diffracting elements, and in this embodiment there are transmitting means 23 and 24 which, offset in the direction of the X axis in turn for three emitter groups 2 offset in this coordinate direction or their beams S1, S2, and S3, form three light diffracting areas 23' and 24' such that on means 23 the beams are in turn deflected at different angles relative to the Z axis and then are deflected in means 24 into the beam planes offset parallel against one another in the Y axis.

Means 23 and 24 or their areas 23' and 24' are each lattice-like structures suitable for diffracting light.

Furthermore, to deflect laser beams S1–S3, nontransmitting, specifically reflecting light-diffracting elements are conceivable, similar to reflection element 12 or 19, the reflection or mirror surfaces there being replaced by corresponding structures which cause reflection by light diffraction.

FIGS. 7–14 do not show collimating lenses 9 and 14. In these embodiments however one such collimating lens at a time is used when the collimated beams are to be imaged at common focal point 3 or 14. Of course, in the embodiments of FIGS. 7–14 there is also fundamentally the possibility of providing several rows of emitters or emitter groups again.

The invention was described above using embodiments. It goes without saying that other versions and modifications are possible without departing from the inventive idea underlying the invention. Thus it is possible, instead of several emitters which form one group at a time, to also handle individual emitters or several groups formed from subgroups in the same way, each subgroup having for its part a plurality of emitters.

| Reference number list | |
|---|---|
| 1, 1a | laser diode arrangement |
| 2 | emitter group |
| 3 | focal point |
| 4 | cylindrical lens arrangement |
| 6, 7, 6a, 7a | prism block |
| 6', 7' | prism element |
| 8, 8a, 8b | cylindrical lens arrangement |
| 8' | cylindrical lens arrangement |
| 9 | collimating lens |
| 10 | prism block |
| 11 | disk |
| 12 | reflection element |
| 12' | reflection surface |
| 13 | collimating lens |
| 14 | focal point |
| 15 | prism block |
| 15' | prism element |
| 15" | recess |
| 16 | mirror |
| 17, 18 | collimation optics |
| 19 | mirror |
| 20–22 | mirror surface |
| 23, 24 | light-diffracting means |
| 23', 24' | light-diffracting area |

We claim:

1. An optical arrangement for collimation of a plurality of laser beams of several emitters or emitter groups of a laser diode arrangement which are located in one row or in several rows, the emitters or emitter groups of one row being located with their active layer in one common plane and with a stipulated distance in one axial direction, the optical arrangement comprising first cylindrical collimation optics which causes collimation of said plurality of laser beams of the emitters or emitter groups in a first plane (Y-Z planes) which is perpendicular to a first coordinate direction (X axis), and second cylindrical collimation optics which cause collimation of said plurality of laser beams of the emitters or emitter groups in a second plane (X-Z planes) which is perpendicular to said first plane (Y-Z plane) and also perpendicular to a second coordinate direction (Y axis), wherein the optical arrangement comprises means for deflection of said plurality of laser beams of adjacent emitters or emitter groups in said first plane (Y-Z plane) such that collimated laser beams of said adjacent emitters or emitter groups after passage through said second cylindrically acting collimation optics are present parallel to one another in different beam planes offset against one another.

2. The optical arrangement as claimed in claim 1, wherein the emitters or emitter groups of each row are located in said first coordinate direction (X axis) with a stipulated distance (a).

3. The optical arrangement as claimed in claim 1, wherein beam planes in one axial direction (offset direction) are perpendicular to said first coordinate direction (X axis), and offset against one another in a second or a third coordinate direction (Y axis or Z axis).

4. The optical arrangement as claimed in claim 1, wherein the emitters or emitter groups of said laser diode arrangement are imaged in a common spacial area or focal point following said second cylindrically acting collimation optics by focussing optics by which said plurality of laser beams are imaged into said common spacial area or said focal point.

5. The optical arrangement as claimed in claim 1, further comprising deflection means in a beam path between said first cylindrically acting collimation optics and said second cylindrically acting collimation optics such that said plurality of laser beams are arranged parallel to one another in different beam planes before entering the second collimation optics.

6. The optical arrangement as claimed in claim 1, wherein at least two beam planes are formed by deflection means of said plurality of laser beams.

7. The optical arrangement as claimed in claim 1, wherein said first and second cylindrically acting collimation optics are formed by at least one biconvex or plano-convex cylindrical lens with aspherical curvature, by at least one concave mirror or by optical means which image in the manner of a cylindrical lens.

8. The optical arrangement as claimed in claim 1, wherein said second cylindrically acting collimation optics in the beam planes has at least one collimation element at a time, and wherein said at least one collimation element is offset from beam plane to beam plane each time by an amount (a) in the first coordinate direction (X axis) which corresponds to said distance (a) of the emitters, or emitter groups of a row, or which is proportional to said distance (a).

9. The optical arrangement as claimed in claim 8, wherein said second cylindrically acting collimation optics is a cylindrical lens arrangement has at least one cylindrical lens element which is oriented with its cylindrical axis in the offset direction (Y axis) or perpendicular to the second plane (X-Z plane).

10. The optical arrangement as claimed in claim 9, wherein said cylindrical lens arrangement or said cylindrical lens element is made plano-convex.

11. The optical arrangement as claimed in claim 9, wherein said cylindrical lens arrangement or said cylindrical lens element is made spherical.

12. The optical arrangement as claimed in claim 9, wherein said second cylindrical lens arrangement or said cylindrical lens element is made aspherical.

13. The optical arrangement as claimed in claim 1, wherein the means for deflection of said plurality of laser beams have a first prism arrangement or first prism block which in the first coordinate direction (X axis) following one another has several prism elements, of which each is assigned to one emitter or emitter group, and their average distance in the first coordinate direction (X-axis) is equal to distance (a) of the emitters or emitter groups of one row, and wherein said prism elements cause a different deflection in the respective first plane (X-Z plane) due to a different incline of prism surfaces.

14. The optical arrangement as claimed in claim 1, wherein the means for deflection of said plurality of laser beams have a first light-reflecting or light-diffracting arrangement or a light-reflecting or light-diffracting element, which in the first coordinate direction (X axis) has several reflecting or light-diffracting areas in succession, with an average distance which is equal to distance (a) of the emitters or emitter groups.

15. The optical arrangement as claimed in claim 14, wherein said light-reflecting areas or said surfaces for different deflection of said plurality of laser beams in the first plane (Y-Z plane) have a different incline relative to the second plane (X-Z plane) or the plane of the active layer.

16. The optical arrangement as claimed in claim 1, wherein the means for deflection of said plurality of laser beams have a second prism block or a second prism arrangement which in the beam path or in the direction of the coordinate direction (Y axis or Z-axis) forms an optical axis of the arrangement and follows on first prism arrangement and on deflection element and which forms at least one prism element for each beam plane such that the deflected plurality of laser beams are converted into those in the parallel beam planes.

17. The optical arrangement as claimed in claim 1, wherein the means for deflection of said plurality of laser beams have a second reflecting or light-diffracting arrangement which in the beam path or in the direction of a coordinate direction (Z-axis) forms the optical axis of the arrangement and follows on a first prism arrangement or on a first reflecting or a light-diffracting element and which forms at least one reflection surface or light-diffracting area for each beam plane such that the deflected plurality of laser beams are converted into those in the parallel beam planes.

18. The optical arrangement as claimed in claim 1, wherein there are several rows of the emitters or emitter groups, wherein for each row there is an optical arrangement consisting at least of first collimation optics, of second collimation optics and of means for deflecting said plurality of laser beams of adjacent emitters or emitter groups into the different beam planes, the rows of emitters or emitter groups preferably being provided on top of one another in the second coordinate direction (Y axis).

19. The optical arrangement as claimed in claim 18, wherein second collimation optics or second prism arrangements or prism blocks or second light-reflecting or light-diffracting arrangements or focussing optics (13) for all rows or for a group of rows are combined into one optical assembly.

20. The optical arrangement as claimed in claim 1, further comprising focussing optics which has at least one rotationally-symmetrical collimating lens.

* * * * *